(12) United States Patent
Kim

(10) Patent No.: US 10,854,585 B2
(45) Date of Patent: Dec. 1, 2020

(54) SEMICONDUCTOR PACKAGE WITH IMPROVED POWER INTEGRITY

(71) Applicant: SAMSUNG ELECTRONICS CO., LTD., Suwon-si (KR)

(72) Inventor: Yong Hoon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/287,372

(22) Filed: Feb. 27, 2019

(65) Prior Publication Data

US 2020/0027864 A1    Jan. 23, 2020

(30) Foreign Application Priority Data

Jul. 20, 2018  (KR) .......................... 10-2018-0084572

(51) Int. Cl.
*H01L 25/16* (2006.01)
*H01L 23/538* (2006.01)
(Continued)

(52) U.S. Cl.
CPC .......... *H01L 25/16* (2013.01); *H01L 23/3128* (2013.01); *H01L 23/5383* (2013.01);
(Continued)

(58) Field of Classification Search
CPC . H01L 25/16; H01L 23/5389; H01L 23/3128; H01L 24/16; H01L 23/5386;
(Continued)

(56) References Cited

U.S. PATENT DOCUMENTS 6,946,731 B2   9/2005  Chang et al.
7,489,035 B2   2/2009  Song et al.
(Continued)

FOREIGN PATENT DOCUMENTS

CN        1773699 A     5/2006
JP    2002-261167 A     9/2002
(Continued)

OTHER PUBLICATIONS

Communication dated Aug. 20, 2019, issued by the Korean Intellectual Property Office in counterpart Korean Application No. 10-2018-0084572.

(Continued)

*Primary Examiner* — Alexander O Williams
(74) *Attorney, Agent, or Firm* — Sughrue Mion, PLLC

(57) ABSTRACT

A semiconductor package includes a connection member having first and second surfaces opposing each other and including a redistribution layer, an integrated circuit chip disposed on the first surface of the connection member, and including a plurality of units, at least one capacitor on the first surface of the connection member and in proximity to the integrated circuit chip, and an encapsulant on the first surface of the connection member and encapsulating the integrated circuit chip and the at least one capacitor, wherein the plurality of units include core power units selected from the group consisting of a central processing unit, a graphics processing unit, and an artificial intelligence unit, at least one of the core power units is disposed adjacent to one edge of the integrated circuit chip, and the at least one capacitor is disposed adjacent to the one edge of the integrated circuit chip.

22 Claims, 10 Drawing Sheets

(51) Int. Cl.
*H01L 23/31* (2006.01)
*H01L 23/00* (2006.01)

(52) U.S. Cl.
CPC ...... *H01L 23/5386* (2013.01); *H01L 23/5389* (2013.01); *H01L 24/16* (2013.01); *H01L 24/24* (2013.01); *H01L 2224/16227* (2013.01); *H01L 2224/211* (2013.01); *H01L 2224/24137* (2013.01); *H01L 2224/24195* (2013.01); *H01L 2924/1432* (2013.01); *H01L 2924/1434* (2013.01); *H01L 2924/19041* (2013.01); *H01L 2924/19105* (2013.01)

(58) Field of Classification Search
CPC ................. H01L 23/5383; H01L 24/24; H01L 2224/211; H01L 2224/16227; H01L 2924/1432; H01L 2924/1434; H01L 2924/29041; H01L 2924/19105; H01L 2224/24195; H01L 2224/24137; H01L 24/20; H01L 23/00; H01L 23/31; H01L 25/538; H01L 2924/15311; H01L 2924/18162; H01L 2224/04105; H01L 2924/15192
USPC ........................................................ 257/773
See application file for complete search history.

(56) References Cited

U.S. PATENT DOCUMENTS

| | | | |
|---|---|---|---|
| 9,293,426 | B2 | 3/2016 | Hossain et al. |
| 2014/0077364 | A1* | 3/2014 | Marimuthu ............. H01L 21/56 257/737 |
| 2014/0185264 | A1 | 7/2014 | Chen et al. |
| 2015/0179570 | A1* | 6/2015 | Marimuthu ......... H01L 21/6835 257/774 |
| 2016/0276287 | A1* | 9/2016 | Iwabuchi ............ H01L 23/5223 |
| 2016/0329299 | A1* | 11/2016 | Lin ..................... H01L 23/5226 |
| 2017/0102419 | A1* | 4/2017 | Suwald ................ H05K 1/0275 |
| 2017/0287853 | A1* | 10/2017 | Kim .................... H01L 23/3114 |
| 2020/0020709 | A1* | 1/2020 | Lin .................... H01L 21/28518 |

FOREIGN PATENT DOCUMENTS

| | | |
|---|---|---|
| JP | 2013-62309 A | 4/2013 |
| JP | 2014-110265 A | 6/2014 |
| KR | 10-2017-0112907 A | 10/2017 |
| TW | 517275 B | 1/2003 |

OTHER PUBLICATIONS

Communication dated Jan. 31, 2020, issued by the Taiwan Patent Office in counterpart Taiwanese Application No. 108106181.

\* cited by examiner

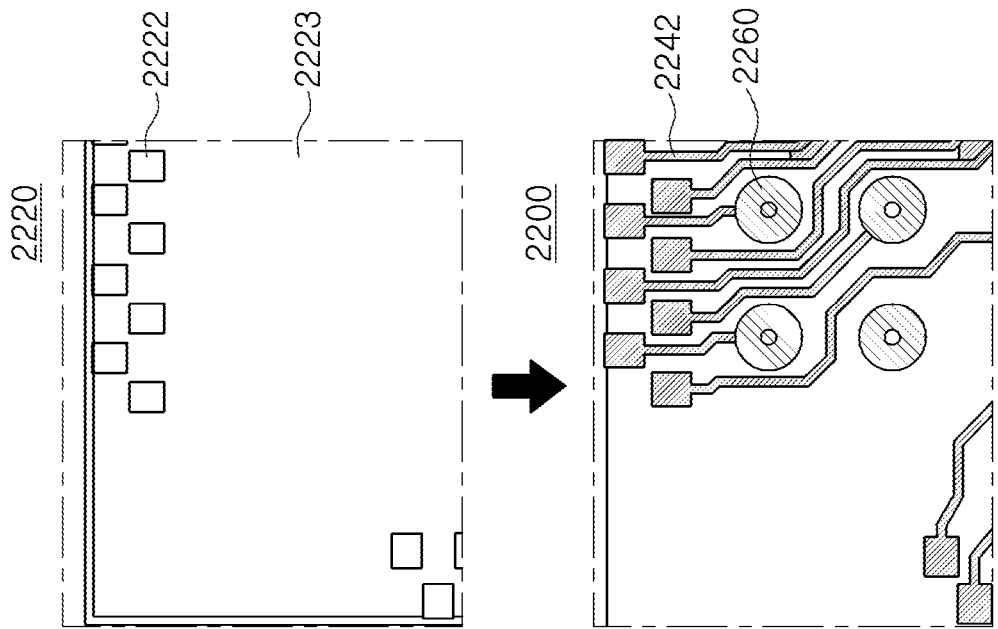
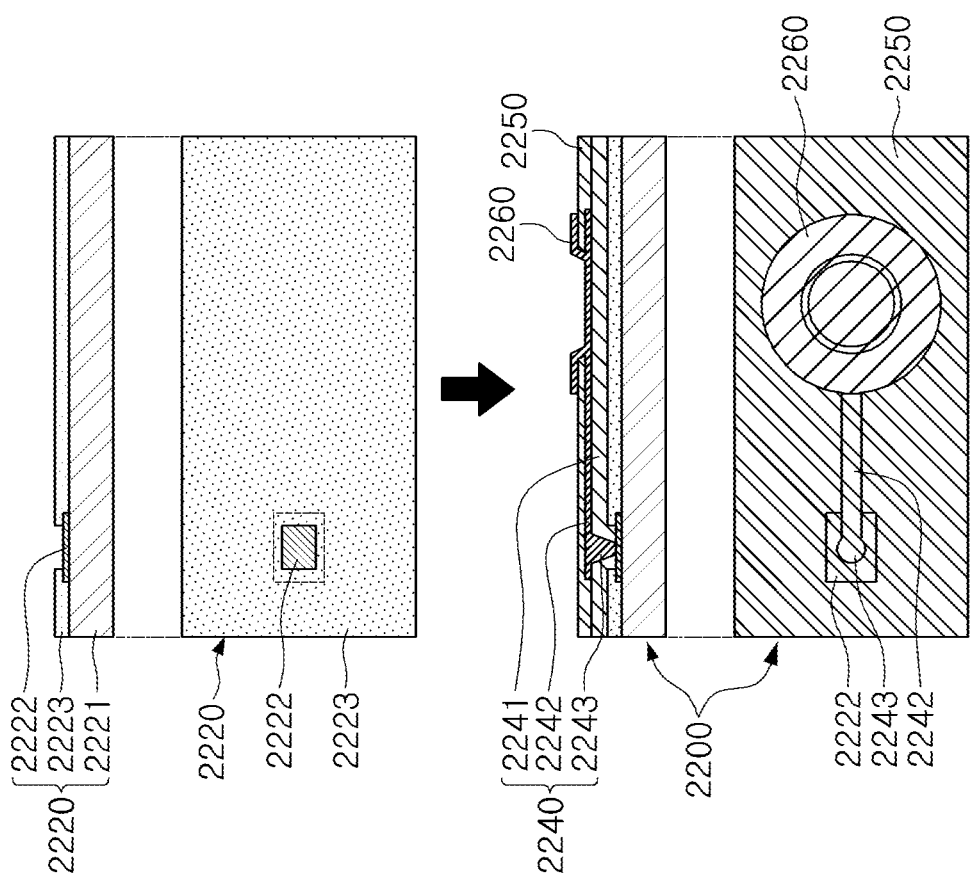
FIG. 3A
FIG. 3B

US 10,854,585 B2

SEMICONDUCTOR PACKAGE WITH IMPROVED POWER INTEGRITY

CROSS-REFERENCE TO RELATED APPLICATION(S)

This application claims the benefit of priority to Korean Patent Application No. 10-2018-0084572, filed on Jul. 20, 2018 in the Korean Intellectual Property Office, the disclosure of which is incorporated herein by reference in its entirety.

TECHNICAL FIELD

The present disclosure relates to a semiconductor package.

BACKGROUND

A major focus in the technical development of semiconductor chips has been placed on reducing the sizes of components, and, in line with the increasing demand for small semiconductor chips and the like, a semiconductor package that is smaller in size while being capable of having a plurality of pins is in demand in the package field. One type of package technology that has been proposed to meet such demand is a fan-out semiconductor package.

Such a semiconductor package includes a package including large-scale integration circuit (LSI) chips which are also referred to as microcontroller units (MCU), microprocessor units (MPU), or system-on-a-chips (SOC). Such a semiconductor package may be widely used in portable electronic devices such as netbook PCs, tablet PCs, smartphones, and portable video game machines. Further, such a semiconductor package may require an uninterrupted supply of power, even in a high-speed switching environment that is typical in high-speed portable electronic devices such as the ones listed above.

SUMMARY

An aspect of the present disclosure may provide a semiconductor package with improved power integrity (PI) by optimizing an internal design of a semiconductor chip and locations of capacitors therein.

According to an aspect of the present disclosure, a semiconductor package includes: a connection member having first and second surfaces opposing each other, and including a redistribution layer; an integrated circuit chip disposed on the first surface of the connection member, having a connection electrode connected to the redistribution layer, and being constituted by a plurality of units; at least one capacitor disposed in proximity to the integrated circuit chip on the first surface of the connection member; and an encapsulant disposed on the first surface of the connection member, and encapsulating the integrated circuit chip and the at least one capacitor, wherein the plurality of units include power core units selected from the group consisting of a central processing unit (CPU), a graphics processing unit (GPU), and an artificial intelligence unit (AI), at least one of the core power units is disposed adjacent to one edge of the integrated circuit chip, and the at least one capacitor is disposed adjacent to the one edge of the integrated circuit chip.

According to another aspect of the present disclosure, a semiconductor package includes: a connection member having first and second surfaces opposing each other, and including a redistribution layer; an integrated circuit chip disposed on the first surface of the connection member, having a connection electrode connected to the redistribution layer, and being constituted by a plurality of units; a plurality of capacitors disposed in close proximity to the integrated circuit chip on the first surface of the connection member; and an encapsulant disposed on the first surface of the connection member, and encapsulating the integrated circuit chip and the plurality of capacitors, wherein the plurality of units include a first unit having a first power consumption rate, and a second unit having a second power consumption rate lower than the first power consumption rate, the first unit is disposed adjacent to one edge of the integrated circuit chip, the second unit is disposed further inward on the integrated circuit chip than the first unit, and the plurality of capacitors are disposed adjacent to the one edge of the integrated circuit chip.

BRIEF DESCRIPTION OF DRAWINGS

The above and other aspects, features, and advantages of the present disclosure will be more clearly understood from the following detailed description, taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward amounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. The terms "first," "second," etc. may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
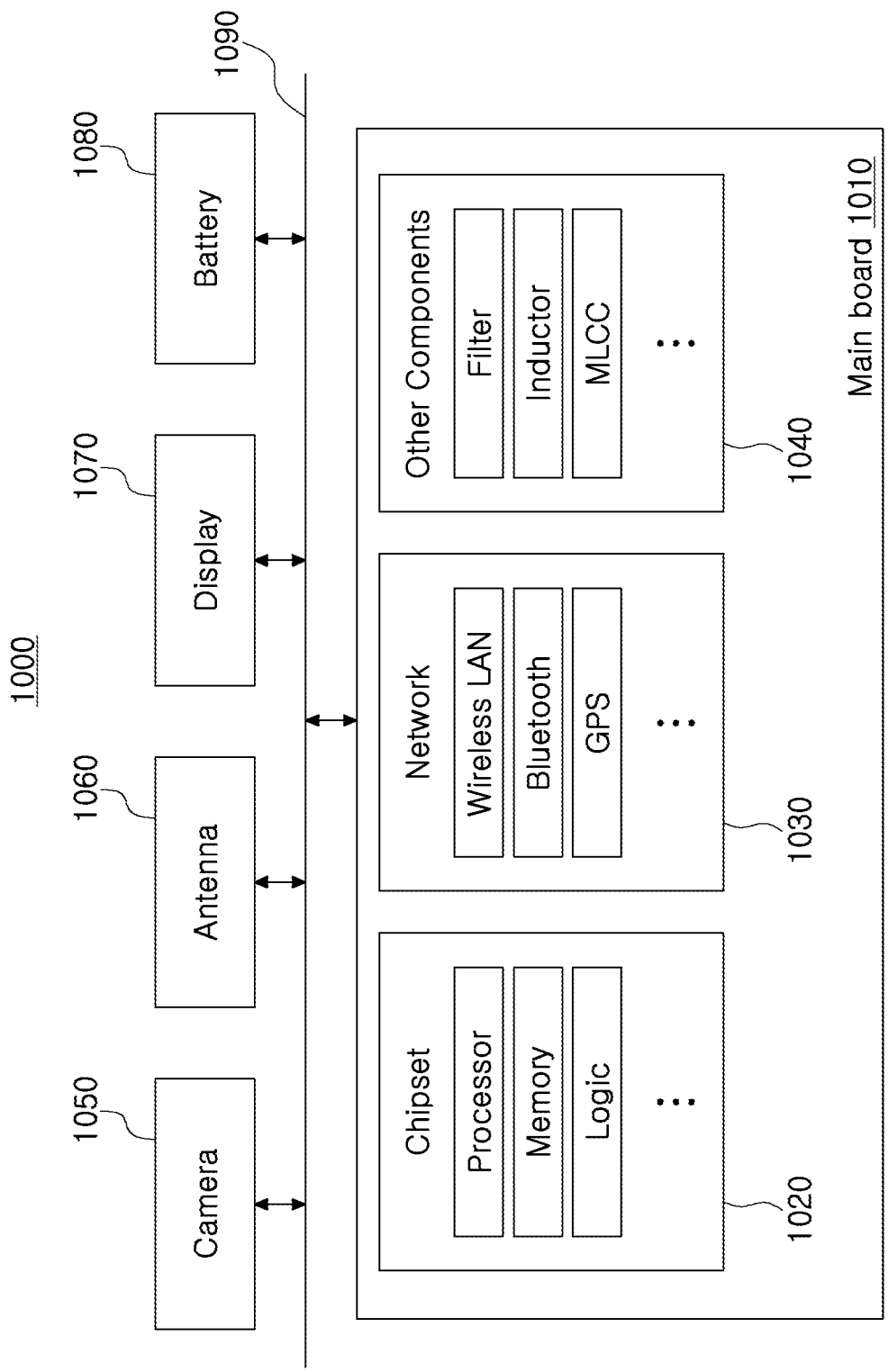
FIG. 1 is a schematic block diagram illustrating an example of an electronic device.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically and/or electrically connected thereto. These components may be connected to others, which will be described below, to form various signal lines 1090.

The chip-related components 1020 may include a memory chip such as a volatile memory (for example, a dynamic random access memory (DRAM)) chip, a non-volatile memory (for example, a read-only memory (ROM)) chip, a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, and the like; and a logic chip such as an analog-digital converter, an application-specific IC (ASIC), and the like. However, the chip-related components 1020 are not limited thereto, and may include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, and may include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, and the like. In addition, other components 1040 may be combined with each other, together with the chip-related components 1020 and/or the network-related components 1030 described above.

Depending on the type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), and the like. However, these other components are not limited thereto, but may also include, depending on the type of the electronic device 1000, other components used for various purposes, and the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
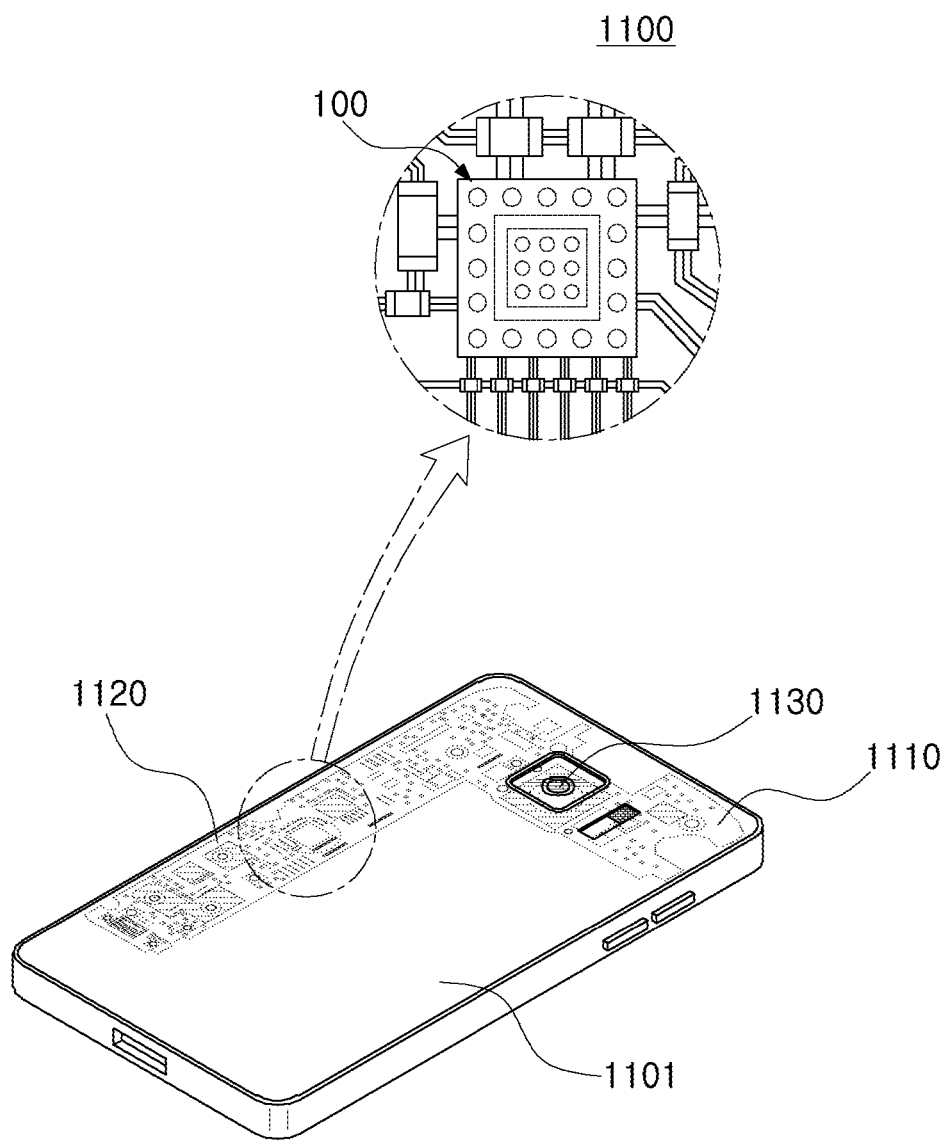
FIG. 2 is a schematic perspective view illustrating an example of an electronic device.

FIG. 2 is a schematic perspective view illustrating an example of an electronic device.

Referring to FIG. 2, a semiconductor package may be used for various purposes in various electronic devices such as the ones described above. For example, a mainboard 1110 may be accommodated in a body 1101 of a smartphone 1100, and various electronic components 1120 may be physically or electrically connected to the mainboard 1110.

In addition, other components that may or may not be physically and/or electrically connected to the mainboard 1010, such as a camera module 1130, may be accommodated in the body 1101. Some of the electronic components 1120 may be the chip-related components, and a semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip cannot serve as a finished semiconductor product in and of itself, and may be at risk of getting damaged from external physical or chemical impact. Therefore, the semiconductor chip is not used in an exposed state, and but is packaged and used in a packaged state in an electronic device or the like.

Semiconductor packaging is required because there is a difference in a circuit width between the semiconductor chip and a mainboard of the electronic device in terms of electrical connection. In detail, in case of a semiconductor chip, sizes of connection pads and intervals between the connection pads are extremely fine, whereas in case of a mainboard used in an electronic device, sizes of component mounting pads and intervals between the component mounting pads are significantly larger than those of the semiconductor chip. Therefore, it may be difficult to mount the semiconductor chip directly on the mainboard, and packaging technology for buffering a difference in the circuit width between the semiconductor chip and the mainboard may be required.

A semiconductor package manufactured by such packaging technology may be classified as a fan-in semiconductor package or a fan-out semiconductor package depending on the structure and the intended use thereof.

The fan-in semiconductor package and the fan-out semiconductor package will hereinafter be described in more detail with reference to the accompanying drawings.

Fan-in Semiconductor Package

Figure 4:
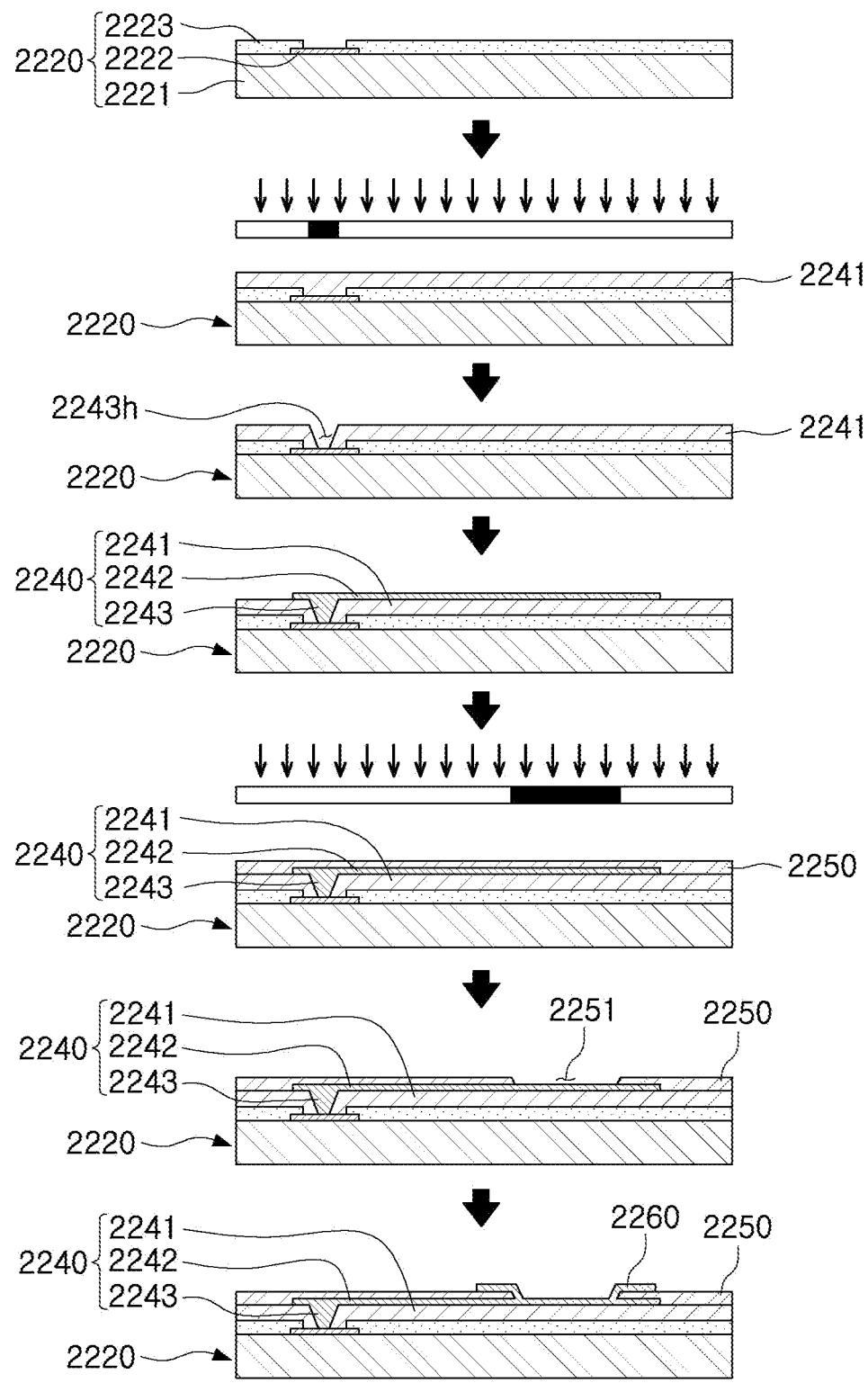
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is a schematic cross-sectional view illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al) and the like, and a passivation layer 2223, being an oxide film, a nitride film, or the like, formed on one surface of the body 2221, and covering at least portions of the connection pads 2222.

Therefore, a connection member 2240 may be formed on the semiconductor chip 2220, according to a particular size of the semiconductor chip 2220, to redistribute the connection pads 2222. The connection member 2240 may be formed by forming an insulating layer 2241 on the semiconductor chip 2220 using an insulating material such as a photoimageable dielectric (PID) resin, thereafter forming via holes 2243h opening the connection pads 2222, and then forming wiring patterns 2242 and vias 2243. Subsequently, a passivation layer 2250 may be formed to protect the connection member 2240, and an opening 2251 may be formed, and then an underbump metal layer 2260 or the like may be formed. Consequently, a fan-in semiconductor package 2200 including, for example, the semiconductor chip 2220, the connection member 2240, the passivation layer 2250, and the underbump metal layer 2260 may be manufactured through a series of processes as described above.

As described above, the fan-in semiconductor package may be in a package form where all of the connection pads, for example, input/output (I/O) terminals, of the semiconductor chip are disposed inside the semiconductor chip. In addition, the fan-in semiconductor package may have desirable electrical characteristics and may be manufactured inexpensively. Therefore, many elements mounted in smartphones have been manufactured in a fan-in semiconductor package form, and particularly, many elements mounted in smartphones have been developed to implement a rapid signal transfer while having a compact size.

However, since the fan-in semiconductor chip requires all the I/O terminals to be disposed inside the semiconductor chip, the fan-in semiconductor package has significant spatial limitations. Thus, it is difficult to apply this structure to a semiconductor chip that has a large number of I/O terminals or a semiconductor chip that has a small size. In addition, due to this disadvantage described above, the fan-in semiconductor package may not be directly mounted and used on the mainboard of the electronic device, because even when sizes of the I/O terminals and intervals between the I/O terminals of the semiconductor chip are increased by a redistribution process, the sizes of the I/O terminals and the intervals between the I/O terminals of the semiconductor chip may not be appropriate enough to permit the fan-in semiconductor package to be directly mounted on the mainboard of the electronic device.

Figure 5:
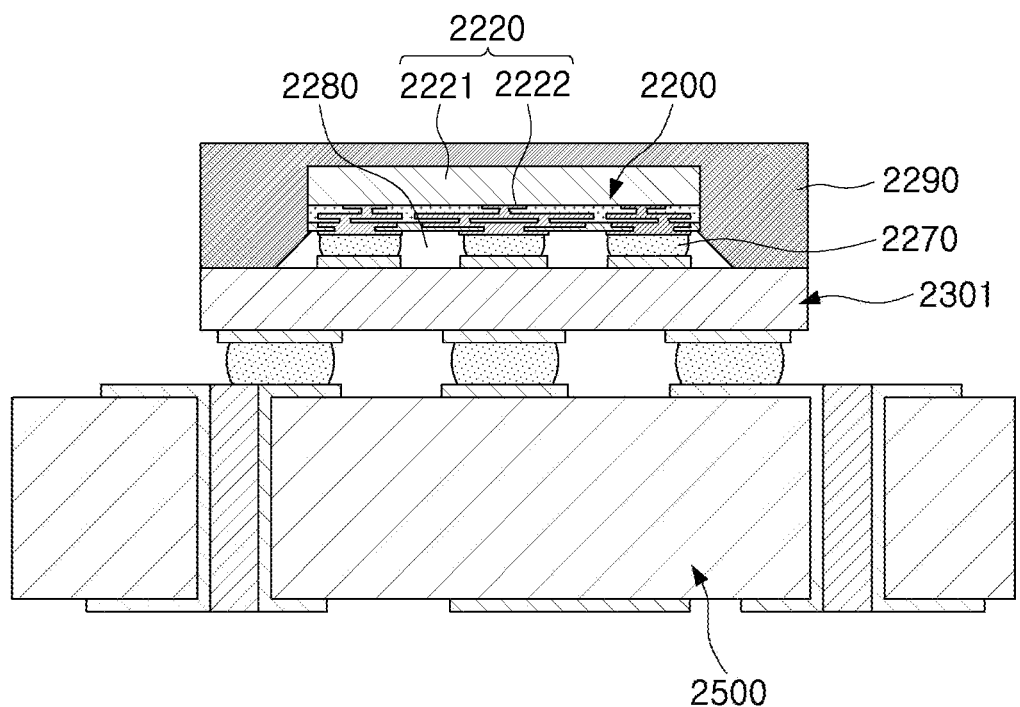
FIG. 5 is a schematic cross-sectional view illustrating a case in which a fan-in semiconductor package is mounted on an interposer substrate and is ultimately mounted on a mainboard of an electronic device.
Figure 6:
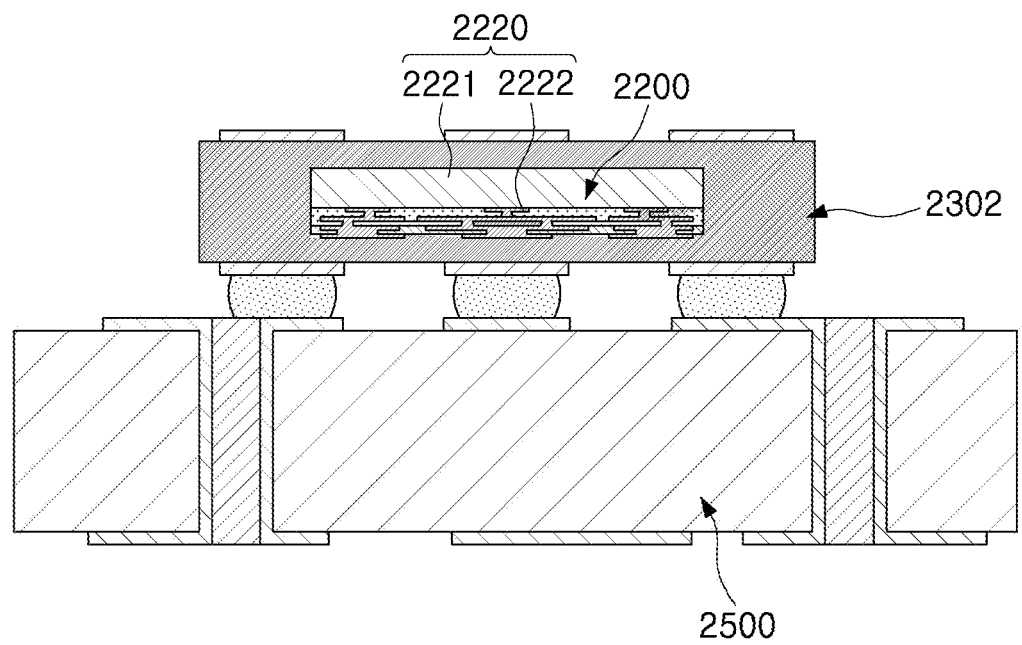
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device. FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, which are I/O terminals, of a semiconductor chip 2220 may be redistributed once more through an interposer substrate 2301, and then, the fan-in semiconductor package 2200, while being mounted on the interposer substrate 2301, may be ultimately mounted on a mainboard 2500 of an electronic device. In this case, low-melting point metal or alloy balls 2270 or the like may be fixed by an underfill resin 2280 or the like, and an outer side of the fan-in semiconductor package 2200 may be covered with an encapsulant 2290 or the like. Alternatively, the fan-in semiconductor package 2200 may be embedded in a separate interposer substrate 2302, and connection pads 2222 of a semiconductor chip 2220, which are I/O terminals, may be redistributed once more by the interposer substrate 2302, and then, the fan-in semiconductor, while being embedded in the interposer substrate 2302, may be ultimately mounted on a mainboard 2500 of an electronic device.

As described above, it may be difficult to directly mount and use the fan-in semiconductor package on the mainboard of the electronic device. Therefore, the fan-in semiconductor package may be used by being mounted on a separate interposer substrate first, and then being mounted on the mainboard of the electronic device through a packaging process. Alternatively, the fan-in semiconductor package may be used by being mounted on the mainboard of the electronic device while being embedded in the interposer substrate.

Fan-Out Semiconductor Package

Figure 7:
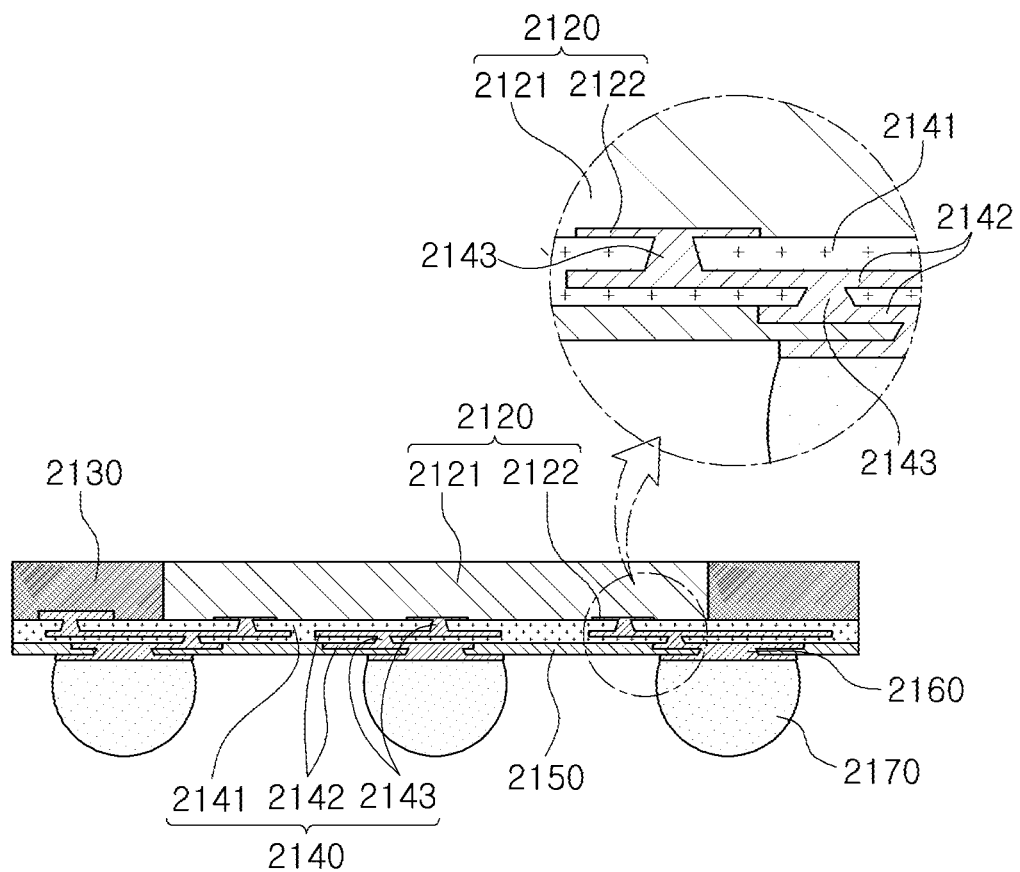
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed even outside of the semiconductor chip 2120 by a connection member 2140. In this case, a passivation layer 2150 may further be formed on the connection member 2140, and an underbump metal layer 2160 may further be formed in openings of the passivation layer 2150. Low-melting point metal or alloy balls 2170 may further be formed on the underbump metal layer 2160. The semiconductor chip 2120 may be an integrated circuit (IC) including a body 2121, the connection pads 2122, a passivation film (not illustrated), or the like. The connection member 2140 may include an insulating layer 2141, a redistribution layer 2142 formed on the insulating layer 2141, and vias 2143 electrically connecting the connection pads 2122, the redistribution layers 2142, and the like, to each other.

In the present manufacturing process, the connection member 2140 may be formed after the encapsulant 2130 is formed outside the semiconductor chip 2120. In this case, a process for the connection member 2140 is performed after the semiconductor chip 2120 is encapsulated, and thus, the vias 2143 connected to the redistribution layer may be formed to have widths that become smaller as they approach the semiconductor chip 2120 (please refer to an enlarged region).

As described above, the fan-out semiconductor package has a form in which the I/O terminals of the semiconductor chip are redistributed and disposed even outside of the semiconductor chip through the connection member formed on the semiconductor chip. On one hand, the fan-in semiconductor package has a form in which all the I/O terminals of the semiconductor chip need to be disposed inside the semiconductor chip, so as the size of the semiconductor chip decreases, sizes and pitches of balls also need to be decreased, thus rendering a standardized ball layout inapplicable in the fan-in semiconductor package. On the other hand, as described above, the fan-out semiconductor package has a form in which the I/O terminals of the semiconductor chip are redistributed and disposed even outside of the semiconductor chip through the connection member formed on the semiconductor chip, so a standardized ball layout can be used in the fan-out semiconductor package as is, even when the size of the semiconductor chip decreases. As a result, the fan-out semiconductor package may be mounted on the mainboard of the electronic device without using a separate interposer substrate, as will be described below.

Figure 8:
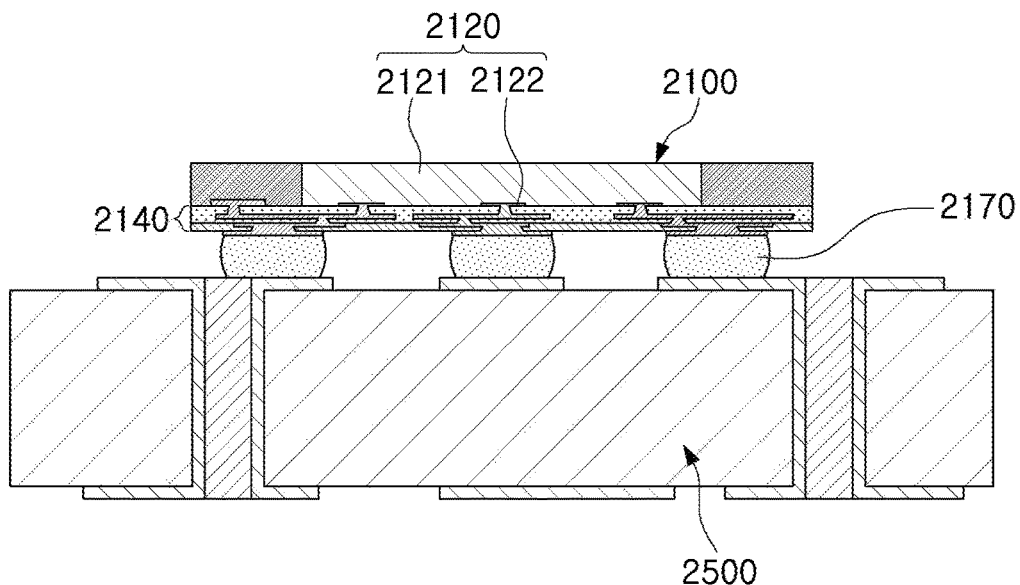
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low-melting point metal or alloy balls 2170 or the like. More specifically, as described above, since the fan-out semiconductor package 2100 may include a connection member 2140 formed on a semiconductor chip 2120 and capable of redistributing connection pads 2122 even to a fan-out region outside of a particular size of the semiconductor chip 2120, the fan-out semiconductor package 2100 may permit a standardized ball layout to be used as is, and as a result, may be mounted on a mainboard 2500 of an electronic device without using a separate interposer substrate or the like.

As described above, since a fan-out semiconductor package may be mounted on a mainboard of an electronic device without using a separate interposer substrate, the fan-out semiconductor package may be realized to have a thickness smaller than that of a fan-in semiconductor package using an interposer substrate. Thus, the fan-out semiconductor package may be miniaturized and thinned. In addition, the fan-out semiconductor package has excellent thermal characteristics and electrical characteristics, and thus is particularly suitable for mobile products. Further, the fan-out semiconductor package may be realized in a more compact form than a general package-on-package (POP) type package using a printed circuit board (PCB), and may resolve the issues arising from warpage.

As described above, the fan-out semiconductor package refers to package technology for enabling the semiconductor chip to be mounted on the mainboard of the electronic device or the like, and further, protecting the semiconductor chip from external impact. As such, the fan-out semiconductor package is based in a different concept than a printed circuit board (PCB) such as an interposer substrate having a fan-in semiconductor package embedded therein that has a different scale, a different use, and the like, as compared to the fan-out semiconductor package.

Figure 9:
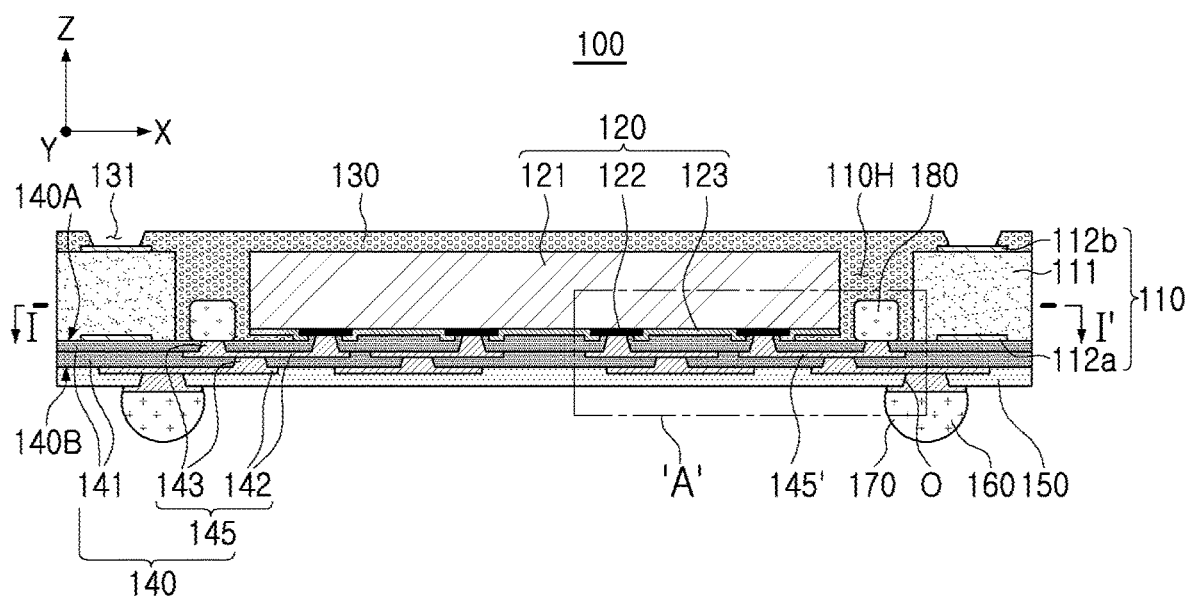
FIG. 9 is a schematic cross-sectional view of a semiconductor package according to an exemplary embodiment in the present disclosure.
Figure 10:
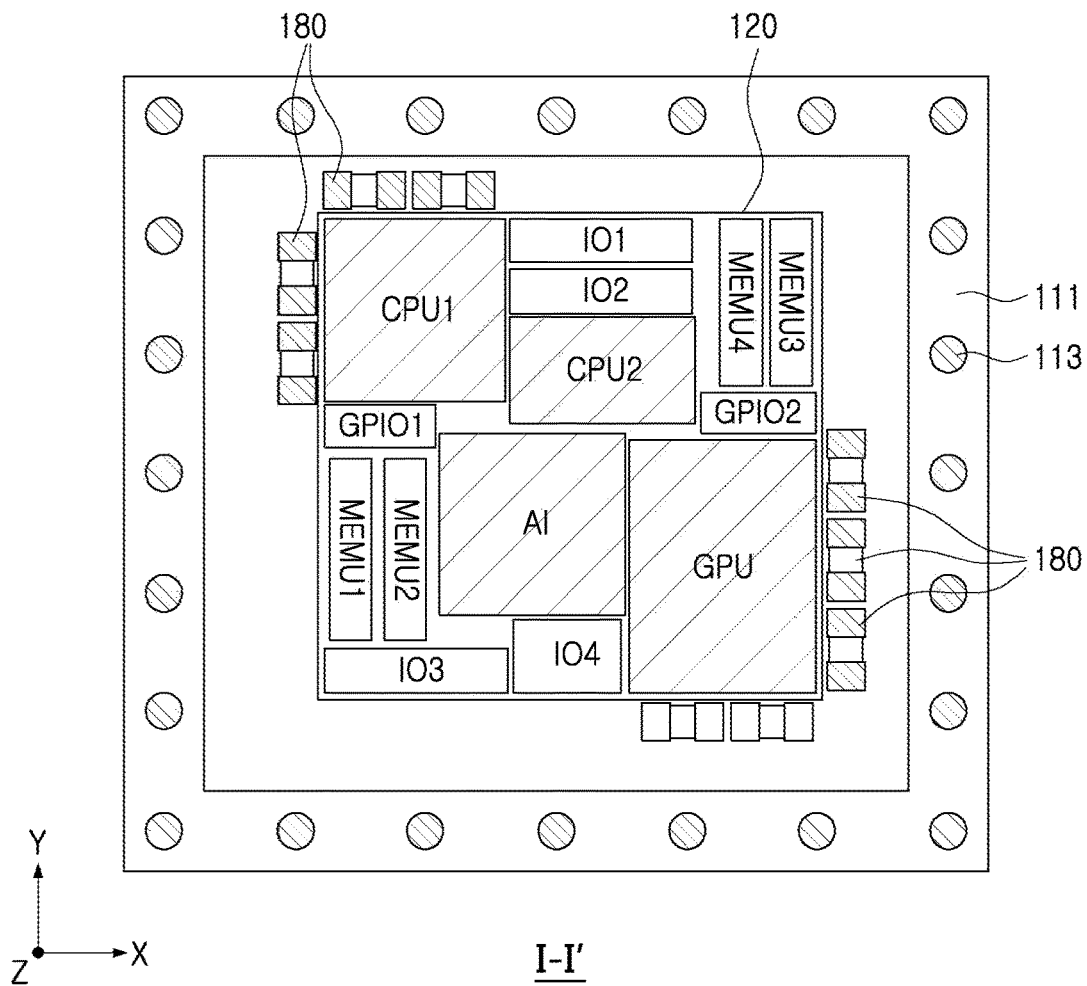
FIG. 10 is a plan view illustrating a semiconductor package taken along line I-I' in FIG. 9.

FIG. 9 is a schematic cross-sectional view illustrating a semiconductor package according to an exemplary embodiment. FIG. 10 is a plan view illustrating a semiconductor package taken along line I-I' in FIG. 9.

Referring to FIGS. 9 and 10, a semiconductor package 100 according to the present exemplary embodiment may include: a connection member 140 having a first surface 140A and a second surface 140B opposing each other, and including a redistribution layer 145; an integrated circuit chip 120 disposed on the first surface 140A of the connection member 140, and having a connection electrode 122 connected to the redistribution layer; a plurality of capacitors 180 disposed in close proximity to the integrated circuit chip 120 on the first surface 140A of the connection member 140; and an encapsulant 130 disposed on the first surface 140A of the connection member 140, and encapsulating the integrated circuit chip 120 and the plurality of capacitors 180.

In the present exemplary embodiment, the semiconductor package 100 may include a support member 110 disposed on the first surface of the connection member and having a cavity 110H. The integrated circuit chip 120 and the plurality of capacitors 180 may be accommodated in the cavity 110H.

In addition, the semiconductor package 100 may further include a passivation layer 150 disposed on the second surface 140B of the connection member 140, an underbump metal (UBM) layer 160 disposed on the passivation layer 150 and connected to the redistribution layer through openings (O) of the passivation layer 150, and an electrical connection structure 170 disposed on the UBM layer 160.

The integrated circuit chip 120 used in the present exemplary embodiment may be a semiconductor chip constituted by a plurality of units, and may include a large-scale integration circuit chip (LSI) including various logic circuits and memory circuits. Such an integration circuit chip 120 may be referred to as a microcontroller unit (MCU), a microprocessor unit (MPU), or a system-on-a-chip (SOC). For example, the integrated circuit chip 120 may be formed on a single semiconductor substrate such as silicon, by using a previously disclosed semiconductor manufacturing technique.

As illustrated in FIG. 10, the plurality of units may include central processing units CPU1 and CPU2, a graphics processing unit GPU, an artificial intelligence unit AI, input output units 101-104, GPIO1, and GPIO2, and memory units MEMU 1-4.

The central processing units CPU1 and CPU2 may control a semiconductor device, and the graphics processing unit GPU may perform an image processing. The input and output units IO1 and IO2 may be an interface for performing input and output of data between the integrated circuit chip 120 and an external device. The memory units MEMU 1-4 may be memory such as dynamic random access memory (DRAM), static random access memory (SRAM), flash, phase-change memory (PRAM), resistive random access memory (ReRAM), ferroelectric random access memory (FeRAM), or magnetoresistive random access memory (MRAM).

In addition, the integrated circuit chip 120 may further include, depending on the use thereof, an interrupt controller (INTC), a communication unit (CMU), a direct memory access controller (DMAC), an analog-to-digital convertor (ADC), and a clock pulse generator (CPG).

The above-described units of the integrated circuit chip 120 may be classified according to their power consumption rate. In this present disclosure, the units having relatively large power consumption rates may be referred to as "core power units", and the units having relatively low power consumption rates may be referred to as "low power units".

In the present exemplary embodiment, the central processing units CPU1 and CPU2, the graphics processing unit GPU, and/or the artificial intelligence unit AI may correspond to the core power units, and the input output units IO1-IO4, GPIO1, and GPIO2, or the memory units may correspond to the low power units.

Figure 12A:
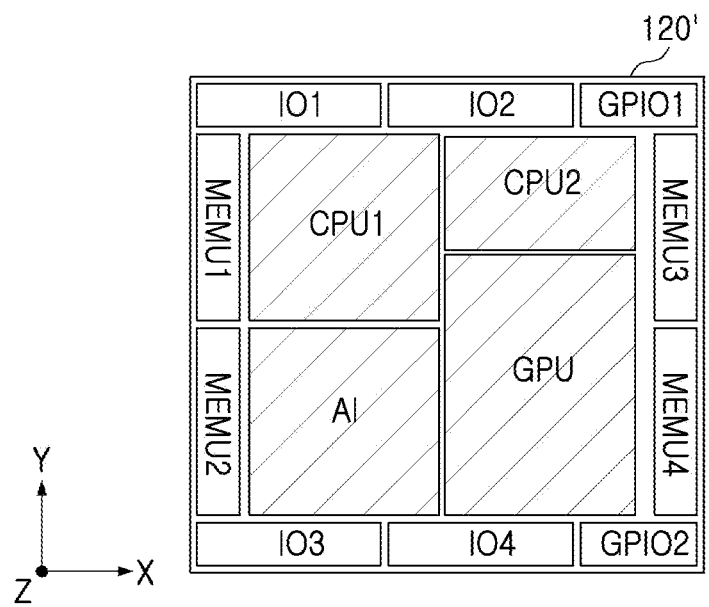
FIGS. 12A and 12B are block diagrams for describing a change in layout of various units of an integrated circuit chip.
Figure 12B:
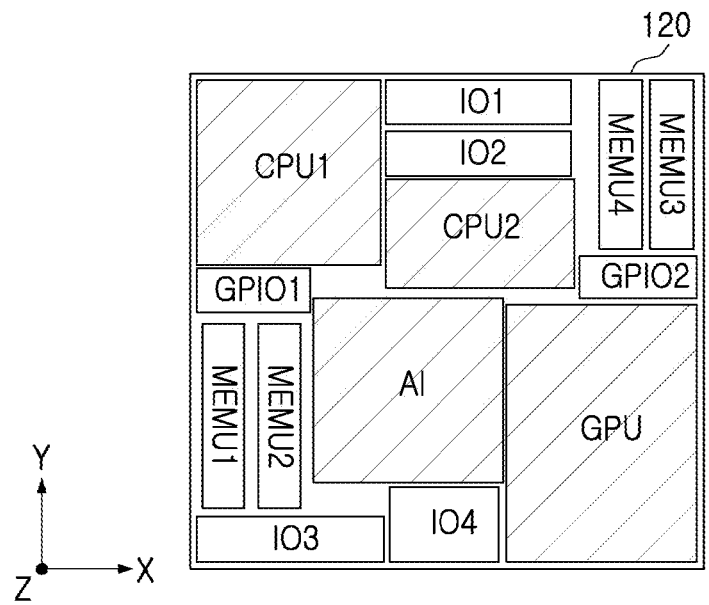

According to such power consumption rates, a layout of the units constituting the integrated circuit chip may be modified. FIGS. 12A and 12B are block diagrams describing changes in layout of various units on an integrated circuit chip. In particular, a layout illustrated in FIG. 12a may be understood as an exemplary embodiment before being modified, and a layout illustrated in FIG. 12b may be understood as an exemplary embodiment after being modified.

Referring to FIG. 12A, in a conventional integrated circuit chip 120, core power units with large power consumption rates, since they occupy relatively larger areas, were typically disposed within a chip area, whereas low power units such as input output units IO1-IO4, GPIO1, and GPIO2, which tend to occupy relatively smaller areas, were typically disposed adjacent to edges of a chip to facilitate input and output with an external device.

On the other hand, in an integrated circuit chip used in the present exemplary embodiment, at least one of the core power units may be disposed adjacent to an edge of an integrated circuit chip 120. For example, as illustrated in FIG. 12b, processing devices that occupy relatively larger areas, such as CPU1 and GPU, may be disposed along respective opposing edges of the integrated circuit chip 120. According to such a layout, at least one of a plurality of low power units may be disposed facing an edge of the integrated circuit chip 120 with another unit interposed therebetween. For example, one memory unit MEMU2 and one input output unit IO2 may be spaced apart from one edge of the integrated circuit chip 120 with another memory unit MEMU1 and another input output unit IO1 interposed therebetween, respectively.

As illustrated in FIG. 10, the integrated circuit chip 120 having such a layout may allow units with relatively large power consumption rates to be disposed closer to decoupling capacitors 180. The plurality of capacitors 180 may be disposed along edges of the integrated circuit chip 120 that have the CPU1 and the GPU disposed adjacent thereto.

For example, the CPU1 and the GPU with large power consumption rates may be disposed in two opposing corners of the integrated circuit chip 120, and the plurality of capacitors 180 may be arranged along two edges adjacent at each corner. As such, core power units disposed in corners of the integrated circuit chip 120 may allow a greater number of capacitors, or a capacitor with larger capacitance, to be disposed adjacent to the core power units by utilizing the two adjacent edges.

As described above, when the plurality of units constituting the integrated circuit chip 120 include a first unit with a first power consumption rate and a second unit with a second power consumption rate lower than the first power consumption rate, within the integrated circuit chip, the first unit (for example, CPU1 or GPU) may be disposed adjacent to one edge of the integrated circuit chip 120, the second unit (for example, MEMU2 or IO2) may be disposed more inwardly on the integrated circuit chip 120 than is the first unit, and the plurality of capacitors 180 may be disposed adjacent to the one edge of the integrated circuit chip 120.

The connection member 140 may include a redistribution layer 145 connected to the connection electrodes 122 of the integrated circuit chip 120. The connection electrodes 122 of the integrated circuit chip 120 may each be engaged with each of the units, and may be connected to a different region of the redistribution layer 145.

Figure 11:
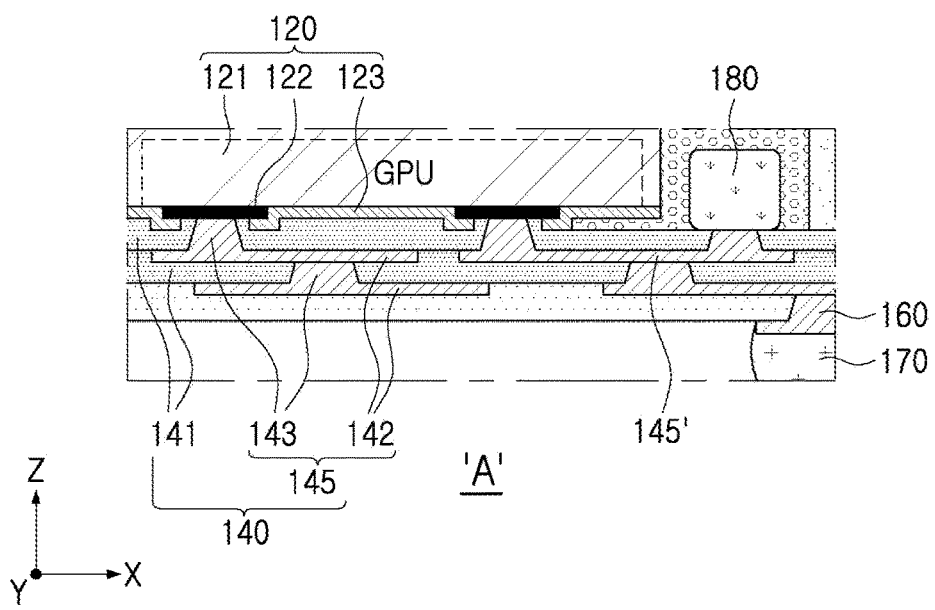
FIG. 11 is an enlarged cross-sectional view illustrating part A of a semiconductor package illustrated in FIG. 9.

As illustrated in FIG. 11, the redistribution layer 145 may include a wiring line 145' connecting a connection electrode 122 engaged with the GPU, which is one of the core power units, directly to a capacitor 180 disposed adjacent thereto. The wiring line 145' may be a power wiring line.

In particular, in the semiconductor package 100 according to the present exemplary embodiment, the GPU disposed adjacent to the edge of the integrated circuit chip 120 and the capacitor adjacent to the edge may be connected to each other through a short wiring line P, thereby reducing equivalent series inductance. As a result, input impedance in high frequency regions may be improved. In addition, in the present exemplary embodiment, the CPU1 and the GPU may be disposed in the corners of the integrated circuit chip 120, and thus may enable a sufficient number of capacitors 180 to be disposed along two edges adjacent to each corner, the total capacitance of the capacitors connected by the wiring line 145 may be increased, and as a result, input impedance in low frequency regions may be improved.

The semiconductor package 100 according to the present exemplary embodiment, when mounted on a main board, may include electrical connection structures 170 such as conductive bumps. Such electrical connection structures 170 may be connected to the redistribution layer 145.

Since the semiconductor package 100 requires uninterrupted power supply, decoupling capacitors (not illustrated) may be additionally deployed adjacent to electrical connection structures 170 disposed on the second surface of the connection member. However, a given space may be limited, and it may be difficult to dispose a sufficient number of such decoupling capacitors. Further, this deployment of an additional decoupling capacitor causes an electrical connection path to become larger between the decoupling capacitor and the integrated circuit chip, thus causing equivalent series inductance to increase.

In the present exemplary embodiment, the capacitors 180 may be disposed to be adjacent to the integrated circuit chip 120 on the first surface 140A of the connection member 140, and the core power units with relatively large power consumption rates may be disposed along edges adjacent to the capacitors 180. This may serve to shorten a connection path, and at the same time, may allow a decoupling capacitor with sufficient capacitance or a sufficient number of decoupling capacitors to be provided to dramatically improve impedance characteristics.

Hereinbelow, main components of the semiconductor package 100 according to the present exemplary embodiment will be described in more detail.

The integrated circuit chip 120 may be formed on the basis of an active wafer. In this case, a base material of a body 121 of the integrated circuit chip 120 may be silicon (Si), germanium (Ge), gallium arsenide (GaAs), or the like. Various circuits may be formed on the body 121 through a semiconductor process. Connection electrodes 122 may be formed to electrically connect the integrated circuit chip 120 to other components, and may be formed of a conductive material such as aluminum (Al) and the like, without being limited thereto. Passivation films 123 exposing the connection electrodes 122 may be formed on the body 121, and the passivation films 123 may include a silicon oxide film and/or a silicon nitride film. Lower surfaces of the connection electrodes 122 may have a step with respect to a lower surface of the encapsulant 130 through the passivation films 123. Thus, the encapsulant 130 may be prevented, to some extent, from bleeding into the lower surfaces of the connection electrodes 122.

A wiring structure may be formed on the support member 110 to further simplify the redistribution layer 145 of the connection member 140. This allows for suppressing a decrease in yield caused by defects that may occur during a process of forming a complicated redistribution layer of the connection member 140, and further allows for manufacturing of a package having a smaller thickness. First and second wiring patterns 112a and 112b may be formed on upper and lower surfaces of the support member 110, and then may be connected to each other through a through chip via (not illustrated) to achieve a desired wiring structure.

In addition, the support member 110 may be formed to have a thickness corresponding to a thickness of the semiconductor chip 120, and the second wiring pattern 112b of the support member 110 may be disposed between an active surface and an inactive surface of the semiconductor chip 120.

Since the support member 110 is not particularly limited in terms of its thickness and may be formed to correspond to a thickness of the integrated circuit chip 120, the support member 110 may be formed by a conventional wafer process, whereas the redistribution layer 145 of the connection member 140 may be formed by a micropattern forming technique using photolithography, to have an even smaller thickness.

Accordingly, thicknesses of the first and second wiring patterns 112A and 112B of the support member 110 may be larger than a thickness of the redistribution layer 145 of the connection member 140.

The insulating material of the support member 110 may use an insulating resin mixed with an inorganic filler. For example, the insulating material of the support member 110 may include a resin containing a stiffener such as an inorganic filler, along with a thermosetting resin such as an epoxy resin or a thermoplastic resin such as polyimide, wherein the inorganic filler may be silica, alumina, or the like. In particular, the insulating material of the support member 110 may include an Ajinomoto build-up film (ABF), an FR-4 resin, a bismaleimide triazine (BT) resin, a photoimageable dielectric resin (PID), or the like. In addition, materials in which the thermosetting resin or thermoplastic resin is impregnated, along with an inorganic filler, in a core material such as glass fibers, glass cloth, glass fabric, or the like, for example, a prepreg may be used, if desired.

The first and second wiring patterns 112A and 112B of the support member 110 may include a conductive material such as copper (Cu), aluminum (Al), silver (Ag), tin (Sn), gold (Au), nickel (Ni), lead (Pb), titanium (Ti), or alloys thereof. The through chip via of the support member 110 may be formed of a conductive material and may be integrated with portions of the first and second wiring patterns 112A and 112B.

Although not illustrated in the drawings, a metal layer may be additionally disposed on a sidewall of the cavity 110H, if desired. The metal layer may serve to effectively release heat generated by the integrated circuit chip 120 and/or to block electromagnetic waves. In particular, a plurality of cavities 110H may be present, and in each of the plurality of cavities 110H, an integrated circuit chip 120 or a passive component such as a capacitor may be disposed, but other structures well known in the related art may be used here as well.

The encapsulant 130 may be formed to protect the integrated circuit chip 120, the capacitors 180, and the support member 110. Encapsulation scheme is not particularly limited so long as it has encapsulated at least portions of the integrated circuit chip 120, the capacitors 180, and the support member 110. For example, the encapsulant 130 may cover the inactive surface of the integrated circuit chip 120 and an upper surface of the support member 110, and may fill a space therebetween. In an embodiment, the encapsulant 130 may fill at least a portion of a space between the connection member 140 and the passivation film 123 of the integrated circuit chip 120. In another embodiment, depending on the material of the encapsulant 130, the encapsulant 130 may serve as an adhesive while reducing buckling by filling the cavity 110H.

For example, the material of the encapsulant 130 is not limited to any particular material, and for example, may use an insulating material. Such an insulating material may be a thermosetting resin such as an epoxy resin, a thermoplastic resin such as polyimide, and a resin containing an inorganic filler in addition to the thermosetting or thermoplastic resin, such as an Ajinomoto build-up film (ABF), an FR-4 resin, a bismaleimide triazine (BT) resin, a photoimageable dielectric resin (PID), and the like. In addition, the encapsulant 139 may use a molding material previously disclosed in the related art, such as an epoxy molding compound (EMC) and the like, and may also use a resin having the thermosetting resin or thermoplastic resin impregnated, along with an inorganic filler, in a core material such as glass fibers and the like, if desired.

The connection member 140 may redistribute the connection electrodes 122 on the integrated circuit chip 120. Several tens to several hundreds of the connection electrodes 122 having various functions may be redistributed through the connection member 140, and may be physically and/or electrically connected to the external device through the electric connection structures 170, depending on their functions. The connection member 140 may be connected to the connection electrodes 122 of the integrated circuit chip 120 to include the redistribution layer 145 extended on a lower surface of the support member 110.

The redistribution layer 145 of the connection member 140 may be connected to the connection electrodes 122 of the integrated circuit chip 120 and to the first wiring pattern 112a of the support member 110, to electrically connect the integrated circuit chip 120 and a redistribution structure of the support member 110.

The redistribution layer 145 may include copper (Cu), aluminum (Al), silver (Ag), tin (Sn), gold (Au), nickel (Ni), lead (Pb), titanium (Ti), or alloys thereof. In a manner similar to that described for the first and second wiring patterns 112a and 112b, the redistribution layer 145 may perform various functions according to a design of its corresponding layer. For example, the redistribution layer 145 may include a ground (GND) pattern, a power (PWR) pattern, a signal (S) pattern, or the like.

The passivation layer 150 is configured to protect the connection member 140 from external physical or chemical damage. The passivation layer 150 may include from several tens to several thousands of openings (O) exposing at least a portion of the redistribution layer 145 of the connection member 140. The passivation layer 150 may use a photoimageable insulating material such as a photoimageable insulating resin, or a solder resist material, without being limited thereto. For example, the passivation layer 150 may use an insulating resin mixed with an inorganic filler, such as Ajinomoto build-up film (ABF) and the like, and when it does, the insulating layer 141 of the connection member 140 as well may include an insulating resin mixed with an inorganic filler.

The electrical connection structures 170 may be used as connection terminals for physically and/or electrically connecting the semiconductor package 100 to the external device (e.g., a mainboard). The electrical connection structures 170 may use a conductive material, for example, a low-melting point alloy such as Sn—Al—Cu. The electrical connection structures 170 may be lands, balls, pins, or the like. The electrical connection structures 170 may be formed by multiple layers or a single layer.

The number, interval, disposition form, or the like, of the electrical connection structures 170 are not particularly limited, and depending on design particulars, may be sufficiently modified by a person skilled in the art. For example, the number of the electrical connection structures 170 may be from several tens to several thousands according to the number of connection electrodes 122 of the integrated circuit chip 120, or may be more or less than several tens to several thousands.

At least one of the electrical connection structures 170 may be disposed in a fan-out region. The fan-out region refers to a region outside of a region in which the integrated circuit chip 120 is disposed. Such a fan-out package may have improved reliability as compared to a fan-in package, may implement a plurality of input/output (I/O) terminals, and may facilitate a 3D interconnection. In addition, as compared to a ball grid array (BGA) package, a land grid array (LGA) package, and the like, the fan-out package may be mounted in an electronic device without using a separate substrate, and thus may be manufactured to have a reduced thickness, as well as to be more price-competitive.

The capacitors 180 employed in the present exemplary embodiment may be multilayer ceramic capacitors (MLCC), and more specifically, multilayer ceramic capacitors (MLCC) currently used as embedded type in the related art, which may provide sufficient capacitance. The capacitors 180 may serve to achieve low equivalent serial inductance (ESL), as well as to provide base capacitance.

Exemplary embodiments according to the present disclosure may be implemented with various modifications. FIG. is a schematic cross-sectional view illustrating a semiconductor package according to one exemplary embodiment of the present disclosure, and FIG. 14 is a plan view of a semiconductor package taken along line II-II' in FIG. 13.

Figure 13:
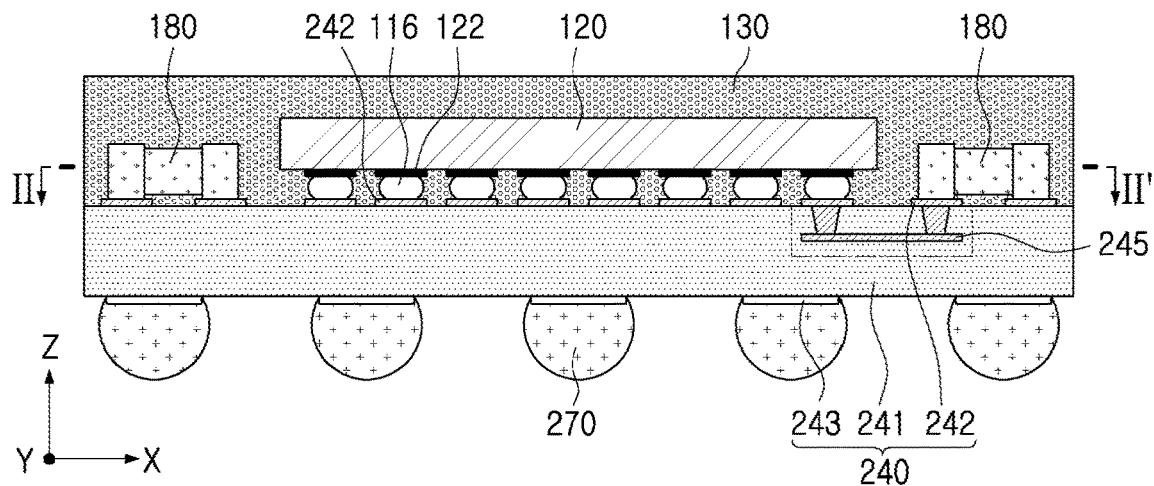
FIG. 13 is a schematic cross-sectional view illustrating a semiconductor package according to one exemplary embodiment in the present disclosure.
Figure 14:
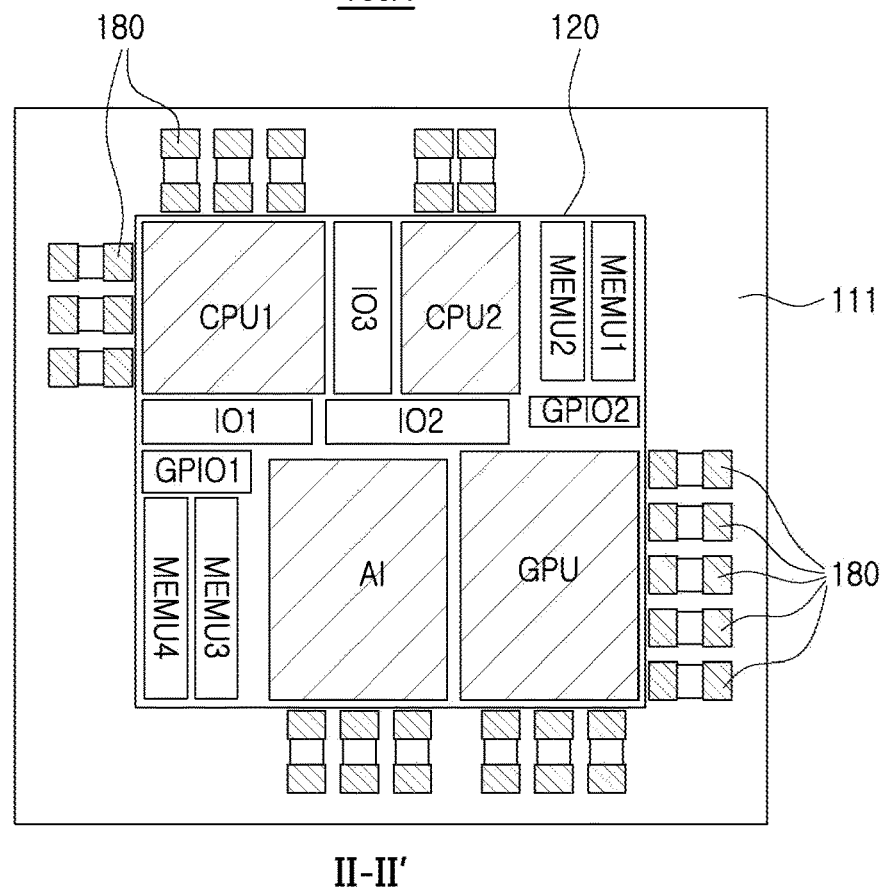
FIG. 14 is a plan view of a semiconductor package taken along line II-II' in FIG. 13.

Referring to FIG. 13 and FIG. 14, it may be understood that a semiconductor package 100A according to the present exemplary embodiment has a structure similar to that illustrated in FIGS. 9 and 10, except that the semiconductor package 100A has a different substrate structure, does not include a support member, and has a different layout of an integrated circuit chip and a different arrangement of capacitors. Components according to the present exemplary embodiment may be understood with reference to the description for the same or similar components of a semiconductor package 100 illustrated in FIGS. 9 and 10 unless explicitly described to the contrary.

The semiconductor package 100A according to the present exemplary embodiment may include an interposer 240 in place of a connection member. The interposer 240 may include a substrate 241, a wiring circuit (not illustrated) formed on the substrate 241, and a plurality of first and second pads 242 and 243 disposed on upper and lower surfaces of the substrate 241, respectively, and connected by a wiring circuit. The wiring circuit may include a wiring line 245 directly connecting the capacitors 180 and the core power unit disposed along an edge of the integrated circuit chip 120.

The substrate 241 of the interposer 240 may be a silicon substrate. However, the substrate 241 of the interposer 240 is not limited thereto, and may be a printed circuit board (PCB) in another example. For example, the substrate 241 may be formed of a thermosetting resin such as an epoxy resin, or a thermoplastic resin such as polyimide, or may be a photoimageable insulating layer. An external terminal 270 may be provided on a plurality of second pads 243 located on the lower surface of the interposer 240. The external terminal 270 may include at least one metal selected from tin (Sn), nickel (Ni), gold (Au), silver (Ag), copper (Cu), and bismuth (Bi), or may include alloys thereof.

The integrated circuit chip 120 may be flip-chip bonded such that an active surface having the connection electrodes 122 disposed thereon is facing the upper surface of the interposer 240. The first pads 242 of the interposer 240 and the connection electrodes 122 may be bonded to connection terminals 116.

In the integrated circuit chip 120 employed in the present exemplary embodiment, the core power units may be disposed adjacent to one edge of the integrated circuit chip 120. For example, as illustrated in FIG. 14, CPU1, CPU2, AI and GPU may be each disposed along an edge or in a corner of the integrated circuit chip 120, whereas a portion of a plurality of low power units, for example, IO2, may be spaced apart from an edge of the integrated circuit chip 120 with another unit interposed therebetween.

The integrated circuit chip 120 having an above-described layout may allow the units with relatively large power consumption rates to be disposed even closer to decoupling capacitors 180. A plurality of such capacitors 180 may be disposed along edges of the integrated circuit chip 120 that have the CPU1, the CPU2, the AI, and the GPU disposed adjacent thereto. Unlike the previous exemplary embodiments, the plurality of capacitors 180 may have rectangular structures, and may be arranged such that only one terminal of each of the plurality of capacitors 180 is disposed adjacent to the edges, so that more capacitors can be arranged to thereby secure sufficient capacitance.

In particular, the CPU1 and the GPU, which consume a large amount of power, may be disposed in two corners of the integrated circuit chip 120, and the plurality of capacitors 180 may be arranged along two edges adjacent to each corner. As such, the core power units disposed in the corners of the integrated circuit chip 120 may allow a greater number of capacitors, or a capacitor with larger capacitance to be disposed adjacent to the core power units by utilizing two adjacent edges.

As set forth above, according to exemplary embodiments of the present disclosure, in an integrated circuit chip including a plurality of units, units with large power consumption rates may be disposed adjacent to edges of the chip, and capacitors may be disposed adjacent to the edges to dramatically improve power integrity (PI) of a semiconductor package.

While exemplary embodiments have been shown and described above, it will be apparent to those skilled in the art that modifications and variations could be made without departing from the scope of the present invention as defined by the appended claims.

What is claimed is:

1. A semiconductor package, comprising:
    a connection member having a first surface and a second surface opposing each other, and including a redistribution layer;
    an integrated circuit chip disposed on the first surface of the connection member, having a connection electrode connected to the redistribution layer, and including a plurality of units;
    at least one capacitor disposed on the first surface of the connection member and disposed adjacent to the integrated circuit chip; and
    an encapsulant disposed on the first surface of the connection member, and encapsulating the integrated circuit chip and the at least one capacitor,
    wherein the plurality of units include core power units, and at least one of the core power units is disposed adjacent to a first edge of the integrated circuit chip, and
    the at least one capacitor is disposed adjacent to the first edge of the integrated circuit chip.

2. The semiconductor package of claim 1, wherein the redistribution layer includes a wiring line directly connecting the core power units and the at least one capacitor.

3. The semiconductor package of claim 1, wherein the at least one capacitor includes a plurality of capacitors arranged along the first edge of the integrated circuit chip.

4. The semiconductor package of claim 1, wherein at least one of the core power units is disposed in a corner of the integrated circuit chip so as to be adjacent to two intersecting edges of the integrated circuit chip.

5. The semiconductor package of claim 4, wherein the at least one capacitor includes a plurality of capacitors arranged along the two intersecting edges.

6. The semiconductor package of claim 1, wherein at least one another core power unit is spaced apart from an edge of the integrated circuit chip with another unit interposed therebetween, and the at least one another core power unit has a power consumption rate lower than that of the at least one of the core power units.

7. The semiconductor package of claim 1, wherein the plurality of units further includes a plurality of low power units, each of the plurality of low power units having a power consumption rate lower than that of each of the core power units, and at least one of the plurality of low power units is spaced apart from an edge of the integrated circuit chip with another unit interposed therebetween.

8. The semiconductor package of claim 7, wherein the plurality of low power units include at least one of an interface unit, a memory unit, and an input output unit.

9. The semiconductor package of claim 1, further comprising a support member disposed on the first surface of the connection member, and having a cavity accommodating the integrated circuit chip and the at least one capacitor.

10. The semiconductor package of claim 9, wherein the support member includes a wiring structure connecting upper and lower surfaces of the support member, and being connected to the redistribution layer.

11. The semiconductor package of claim 1, wherein the core power units include at least one of a central processing unit, a graphics processing unit, and an artificial intelligence unit.

12. A semiconductor package, comprising:
    a connection member having a first surface and a second surface opposing each other, and including a redistribution layer;
    an integrated circuit chip disposed on the first surface of the connection member, having a connection electrode connected to the redistribution layer, and including a plurality of units;
    a plurality of capacitors disposed on the first surface of the connection member and adjacent to the integrated circuit chip; and
    an encapsulant disposed on the first surface of the connection member and encapsulating the integrated circuit chip and the plurality of capacitors,
    wherein the plurality of units includes a first unit having a first power consumption rate and disposed adjacent to one edge of the integrated circuit chip, and a second unit having a second power consumption rate lower than the first power consumption rate and disposed further inward on the integrated circuit chip than the first unit, and
    the plurality of capacitors is disposed adjacent to the one edge of the integrated circuit chip.

13. The semiconductor package of claim 12, wherein the first unit includes at least one unit includes at least one of a central processing unit, a graphics processing unit, and an artificial intelligence unit.

14. The semiconductor package of claim 12, wherein the first unit includes a plurality of first units, and
    the plurality of first units are disposed along another edge or in another corner of the integrated circuit chip.

15. The semiconductor package of claim 12, wherein the second unit includes at least one unit selected from an interface unit, a memory unit, and an input output unit.

16. The semiconductor package of claim 12, wherein the redistribution layer includes a wiring line directly connecting the first unit and the plurality of capacitors.

17. A semiconductor package, comprising:
    an integrated circuit chip comprising a first core power unit disposed adjacent to a first edge of the integrated circuit chip and a first other unit, the integrated circuit chip being disposed on a first surface of a connection member;
    a capacitor disposed on the first surface of the connection member and adjacent to the first edge of the integrated circuit chip; and an encapsulant disposed on the first surface of the connection member and encapsulating at least a portion of each of the integrated circuit chip and the capacitor, wherein the connection member comprises a wiring layer directly connecting the first core power unit and the capacitor.

18. The semiconductor package of claim 17, wherein the connection member further comprises a redistribution layer connected to connection electrodes of the integrated circuit chip.

19. The semiconductor package of claim 17, wherein the integrated circuit chip further comprises a second core power unit having a power consumption rate lower than that of the first core power unit, the second core power unit being disposed away from the first edge with another unit interposed therebetween.

20. The semiconductor package of claim 17, wherein the first other unit has a power consumption rate lower than that of the first core power unit.

21. The semiconductor package of claim 17, wherein the first core power unit includes at least one of a central processing unit, a graphics processing unit, and an artificial intelligence unit.

22. The semiconductor package of claim 17, wherein the first other unit includes at least one of interface unit, a memory unit, and an input output unit.

* * * * *